US012810047B1

(12) United States Patent
Leder et al.

(10) Patent No.: US 12,810,047 B1
(45) Date of Patent: Nov. 24, 2026

(54) OPTIMIZING ASSUMPTIONS FOR EXECUTING A FORMAL VERIFICATION TESTBENCH

(71) Applicant: Amazon Technologies, Inc., Seattle, WA (US)

(72) Inventors: Uri Leder, Lotem (IL); Yagel Mishni, Givataim (IL); Max Chvalevsky, Mevaseret Zion (IL); Miriam Fogel, Jerusalem (IL)

(73) Assignee: Amazon Technologies, Inc., Seattle, WA (US)

( * ) Notice: Subject to any disclaimer, the term of this patent is extended or adjusted under 35 U.S.C. 154(b) by 915 days.

(21) Appl. No.: 18/187,477

(22) Filed: Mar. 21, 2023

(51) Int. Cl.
*G06F 30/3323* (2020.01)
*G06F 30/30* (2020.01)

(52) U.S. Cl.
CPC ................................ *G06F 30/3323* (2020.01)

(58) Field of Classification Search
None
See application file for complete search history.

(56) References Cited

U.S. PATENT DOCUMENTS

| | | | | |
|---|---|---|---|---|
| 7,412,674 | B1 | 8/2008 | Singhal | |
| 8,438,516 | B2 | 5/2013 | Ly | |
| 8,443,317 | B2 | 5/2013 | Hiraoglu | |
| 10,929,584 | B1 * | 2/2021 | Denkberg | G06F 30/3323 |
| 11,544,436 | B1 * | 1/2023 | Leder | G06F 30/323 |
| 11,941,335 | B1 * | 3/2024 | Verma | G06F 30/31 |
| 2010/0192111 | A1 * | 7/2010 | Dsouza | G06F 30/33 716/132 |
| 2010/0269078 | A1 * | 10/2010 | Dsouza | G06F 30/3323 716/111 |
| 2023/0176941 | A1 * | 6/2023 | Lin | G06N 3/09 |

* cited by examiner

*Primary Examiner* — Leigh M Garbowski
(74) *Attorney, Agent, or Firm* — S. Scott Foster; Kowert, Hood, Munyon, Rankin & Goetzel, P.C.

(57) ABSTRACT

Assumptions may be optimized for a formal verification testbench. A design under test and an assumption that places a constraint on an input to the design under test may be obtained as part of executing a formal verification testbench. A behavioral element may be determined to add to the design under test as a replacement for the assumption, the behavioral element providing a signal when the constraint on the input is violated. The behavioral element may be added to the design under test. The assumption may be removed from the formal verification testbench. An assertion of the formal verification testbench may be modified to also check for the signal from the behavioral element. The formal testbench may be executed to apply a formal verification technique to the design under test.

20 Claims, 8 Drawing Sheets

OPTIMIZING ASSUMPTIONS FOR EXECUTING A FORMAL VERIFICATION TESTBENCH

BACKGROUND

Formal verification provides a cost effective design tool when implementing different hardware solutions. A formal verification system may generate a mathematical model or representation of a hardware design, then determine whether a proof exists or can be generated that solves the mathematical model (e.g., by providing a proof to demonstrate correctness of a finite state machine). If a proof exists, then it can be assured that the hardware design is logically sound (although further testing for physical implementation features, such as component layout to account for On-Chip Variation and other physically occurring conditions may still be performed). In this way, problems in the hardware design can be identified.

Figure 1:
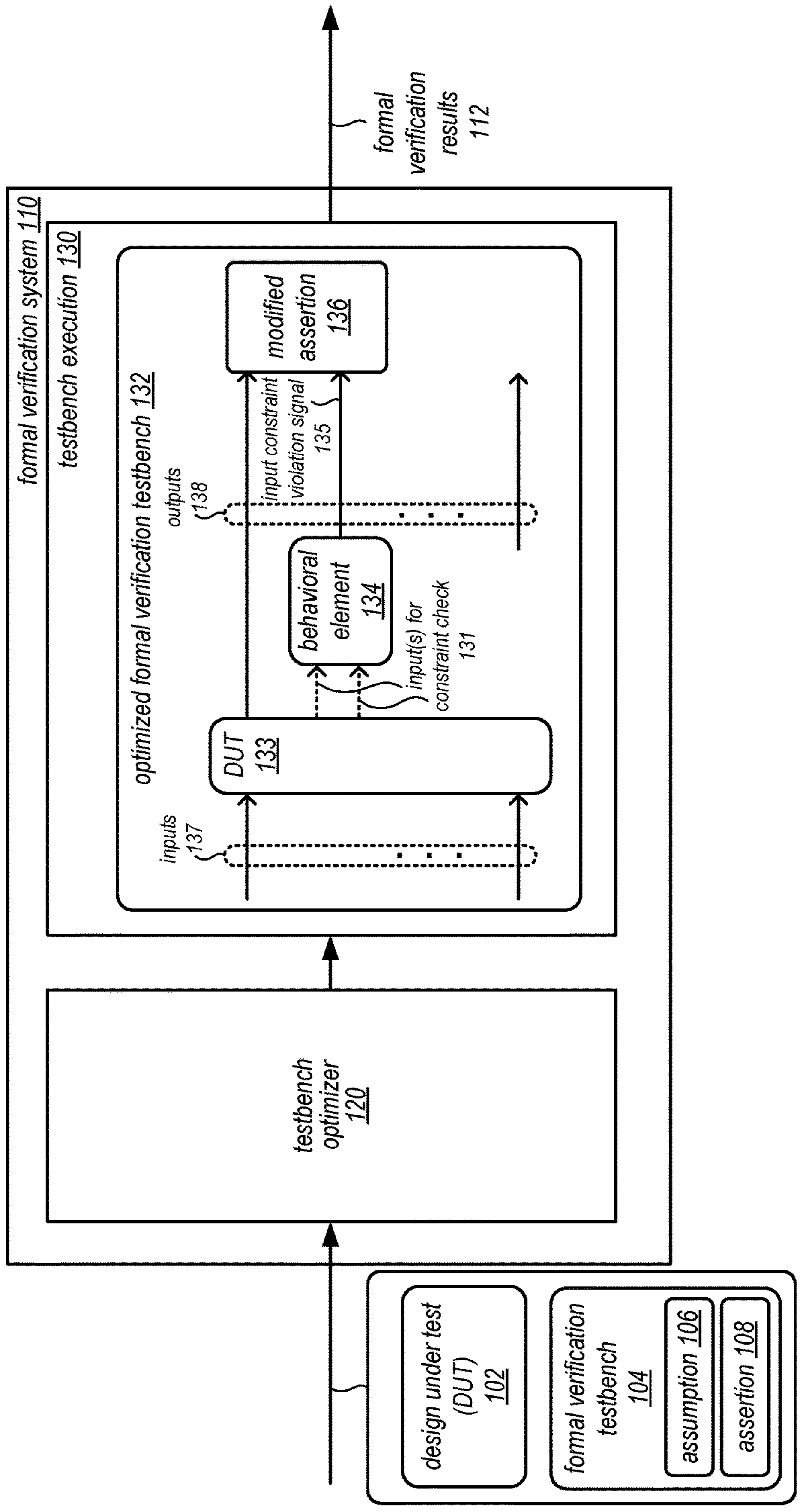
FIG. 1 illustrates a logical block diagram of optimizing assumptions for executing a formal verification testbench, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various techniques of optimizing assumptions for executing a formal verification testbench are described herein. Formal verification techniques offer cost effective verification when designing new hardware, such as integrated circuits. Techniques that can increase the utilization of formal verification systems may reduce design and development costs, decrease the number of undetected bugs, errors, or design flaws, and thus such techniques may be highly desirable. For example, formal verification can be used to prove the correctness of small hardware designs and for larger designs find bugs or partial indications of correctness.

Formal verification techniques, however, have performance limitations. For instance, a formal verification environment may commonly include two parts. The first part may be the generation of correct inbound flow (e.g., inputs to hardware design, the design under test (DUT)). To ensure that formal verification techniques create correct inputs, an assumption feature may be utilized which may constrain the inputs to the DUT. In some embodiments, an assumption may be specified using the keyword "assume", but other embodiments may use entirely different terms or combinations of terms enforce constraints on the input to the DUT and thus be "assumptions." we use system Verilog construct called assumption.

Consider an example for a test environment that uses "assume property (a|→b)." This statement means that when a is 1, b must also be equal to 1. The checker, sometimes referred to as an "assertion" may have a similar structure: "assert property (c|→d)." In this example above a and b are inputs and c and d are outputs. If the DUT contains a bug then the formal verification system should plot a waveform where c==1 and d==0. But the tool cannot plot a waveform where in any place in the waveform would see a==1 and b==0. This waveform would be considered illegal. Thus, it may be the case that some assumptions may slow down the discovery of certain bugs (e.g., when "a==1" and "b==0").

In various embodiments, an optimization for assumptions may be performed so that the assumption can be described as a behavioral element (e.g., using a wire as part of the DUT). For instance, this behavioral element may be an "interrupt". So instead of assume property (a|→b), the assumption could be replaced with behavioral element that provides a signal interrupt=a & ~b. This interrupt could, for example, be put into a flip flop which could remain set (e.g., "1") if the interrupt happened in the past (the output of the flip flop could be called "interrupt_occured"). Such assumption optimization can be applied to multiple (or all) assumptions of a formal verification test environment (also referred to as a formal verification testbench). Further still, in some embodiments, interrupts from multiple assumptions can be collected into one general interrupt, as discussed in detail below with regard to FIG. 4. In this way, the interrupt_occured then will be a sampled version of this general interrupt. To ensure that the occurrence of a violation of an assumption is detected, an assertion (or multiple assertions) can be modified to include the interrupt. For example, "assert property (c|→d)" may be modified to "assert property (c & ~interrupt_occured|→d)."

These assumption optimizations, as described in detail below, may improve the performance of formal verification systems to complete a formal verification of a hardware design. Because assumptions may be more complex to incorporate mathematically into a model used to perform formal verification, behavioral elements can significantly reduce the time used to generate an equivalent result. Moreover, implementing assumptions behaviorally may allow for further optimizations, like those discussed below with regard to FIG. 7, to reduce assumptions that are not relevant to particular assertions.

FIG. 1 illustrates a logical block diagram of optimizing assumptions for executing a formal verification testbench, according to some embodiments. A formal verification system 100 may be a stand-alone tool, application or service, or may be implemented as part of a larger development application or suite of tools for hardware design, such as system verification application 210 discussed below with regard to FIG. 2. Formal verification system 110 may perform formal verification techniques on a hardware design described or otherwise specified according to a hardware language (e.g., such as hardware description languages like VHDL, Verilog, and RHDL, among others). This hardware design may be considered the design under test 102 (sometimes referred to as a DUT). A design under test 102 may include various features or components to accept various inputs, perform various operations, and provide various outputs.

Formal verification system 110 may support formal verification that accounts for the effects of software that interactions design under test 102, as discussed above. For example, formal verification system 110 may implement an interface (e.g., as part of a graphical user interface, command line interface, or other type of interface) through which a formal verification testbench 104 may be specified (in addition to DUT 102). Like DUT 102, formal verification testbench 104 may be specified in a language, such as System Verilog, which supports the use of specifying assumptions, like assumption 106, and assertions, like assertion 108. In various embodiments, assumption 106 may be a property or feature of the formal verification testbench that constrains one or more inputs to the DUT as part of executing formal verification, in some embodiments. In some embodiments, assertion 108 may be a check on one or more output values of the DUT (e.g., a criteria or other condition that the one or more output values should satisfy).

Formal verification system 110 may implement testbench optimizer 120, in some embodiments. As discussed in detail below with regard to FIGS. 3-7, testbench optimizer may utilize various techniques to replace assumptions, such as assumption 106, with a behavioral element, and modify an assertion to evaluate the output of the behavioral element in order to improve the runtime performance formal verification during testbench execution 130. For example testbench optimizer 120, may add one or more logic gates or other embedded verification code as behavioral element 134 to implement optimized formal verification testbench 132. This optimization may still accept inputs 137 to modified DUT 133 but use the added behavioral element 134 to detect a constraint violation on input(s) for constraint check 131. In this way, if a violation occurs, as indicated at 135, modified assertion 136 may fail to assert correctly, even if outputs 138 are correct and provide an indication of a potential counter example (e.g., bug) in DUT 133.

Once optimized, testbench execution 130 may implement a formal verification engine, tool, or other sub-system that applies or otherwise performs formal verification with respect to optimized formal verification testbench 132 and design under test 133. In this way, formal verification techniques can be used to prove the correctness of design under test 102 with greater ability to catch error scenarios that might be otherwise excluded by enforcing assumption 106. Testbench execution 130 may then provide the formal verification results 112 via an interface (e.g., through the graphical user interface, the command line interface, or the other type of interface). The results 112 may indicate the proof of correctness or provide indications of bugs, flaws, or other errors that may be present.

Please note that the previous description of optimizing assumptions for executing a formal verification testbench is merely provided as a logical example. Different numbers of components or configuration of components may be implemented.

This specification continues with a general description of a system verification application, which may implement optimizing assumptions for executing a formal verification testbench. Various examples of different components/modules, or arrangements of components/modules that may be implemented in the system verification application may then be discussed. A number of different methods and techniques to implement optimizing assumptions for executing a formal verification testbench are then discussed, some of which are illustrated in the accompanying flowchart. Various examples are provided throughout the specification.

Figure 2:
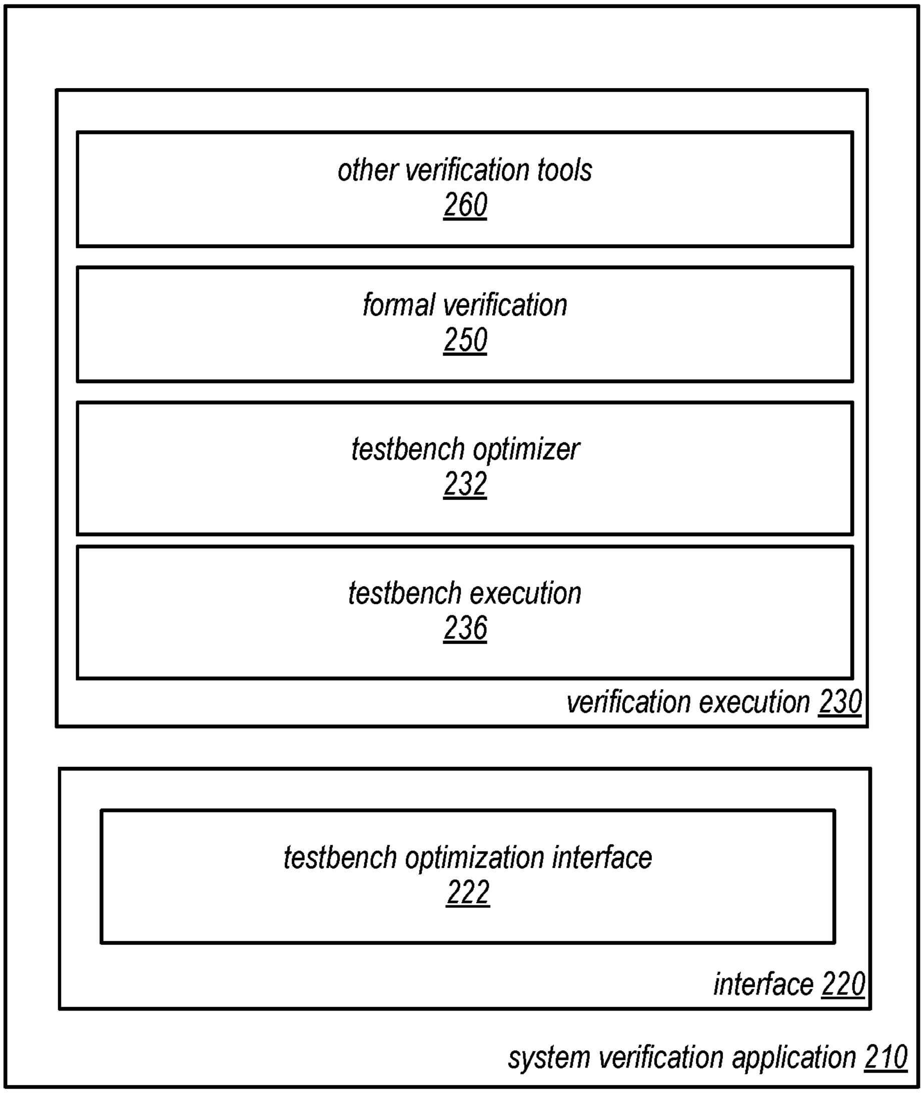
FIG. 2 is a logical block diagram illustrating a system verification application that may implement a testbench optimizer, according to some embodiments.

FIG. 2 is a logical block diagram illustrating a system verification application that may implement testbench optimizer, according to some embodiments. System verification application 210 may provide a set of verification tools or functions (or may be implemented as part of a larger Integrated Development Environment (IDE)) to perform, among other operations, the development and verification of hardware designs via various verification features to develop a language-specified hardware design. System verification application 210 may implement various features, such as interface 220 and verification execution 230, which may be used to perform various verification techniques.

For example, interface 220 may be a programmatic interface implementing one or multiple Application Programming Interfaces (APIs) to invoke different operations, including various requests for executing generated instruction sequences captured from software interactions as part of formal verification of a design under test, a GUI interface that provides various visual control elements for editing, compiling, or other development activities, and/or a command line interface, which may also provide command line controls to edit, compile, or perform other development, design, and/or verification activities. In some embodiments, interface 220 may act as a control console that allows for the configuration of system verification application 210 features. For instance, interface 220 may support requests to configure various parameters or options of verification execution 230, such as providing the software (or features of the software) that may interact with a hardware design which may be executed using virtual platform 260 and the hardware language, assertions, assumptions, cover features, or other criteria or information for performing various verification techniques, such as for formal verification 250. Like FIG. below, interface 220 may provide input support for incorporating testbench optimization 222 as part of performing formal verification, (including code, scripts, or visual objects that represent the operations of a testbench performed by verification execution 230).

Interface 220 may also implement verification task result visualization. Different kinds of verifications may result in different types of visualizations for the verification task results. For example, paths through logical block diagrams may be illustrated to identify a path in a hardware design that traces an error, or state tables may indicate when erroneous or invalid states are achieved by a hardware design or a source of an error, such as a software instruction or command.

System verification application 210 may implement verification execution 230, which may support a common feature set (in addition to interface 220) across multiple different types of verifications supported by different verification engines. For instance, testbench execution tracking may provide a common interface for identifying testbench milestones, estimates, or other tracking features. Testbench debug may implement various debug tools for tracing errors, identifying alternatives or errors proactively (e.g., prior to test), as well as different linking errors in visualizations to error definitions for different verification operations, in some embodiments. In some embodiments, testbench task measurement may provide performance metrics, benchmarks, or other assessments of hardware designs under verification. As noted above, different types of verification techniques may be supported. For example, formal verification 250, static verification, design simulation verification, design emulation verification, and hardware prototyping (e.g., for FPGAs), among other verification engine(s) tools 260.

Testbench execution 236 may receive a testbench (e.g., a formal verification testbench) and access a design under test in order to execute the testbench. Execution of testbench may include performing various configuration tasks or sequences to initialize the design under test. Testbench execution 236 may then perform the various formal verification task(s) to determine the correctness of design under test. Results of the formal verification testbench may be provided, which may include paths through logical block diagrams that may be illustrated to identify a path in design under test that traces an error, or state tables may indicate when erroneous or invalid states are achieved by the design under test or a source of an error, such as a software instruction or command. Included in these results may be an indication of a violation of an assumptions input constraint that was optimized using a behavioral element and signaled as an interrupt.

In various embodiments, the components illustrated in FIG. 2 may be implemented directly within computer hardware, as instructions directly or indirectly executable by computer hardware (e.g., a microprocessor or computer system), or using a combination of these techniques. For example, the components of FIG. 2 may be implemented by a system that includes a number of computing nodes (or simply, nodes) as part of a service, each of which may be similar to the computer system embodiment illustrated in FIG. 8 and described below, in one embodiment. In various embodiments, the functionality of a given system or service component (e.g., a component of system verification application 210) may be implemented by a particular node or may be distributed across several nodes). In some embodiments, a given node may implement the functionality of more than one service system component (e.g., more than one development application component).

Figure 3:
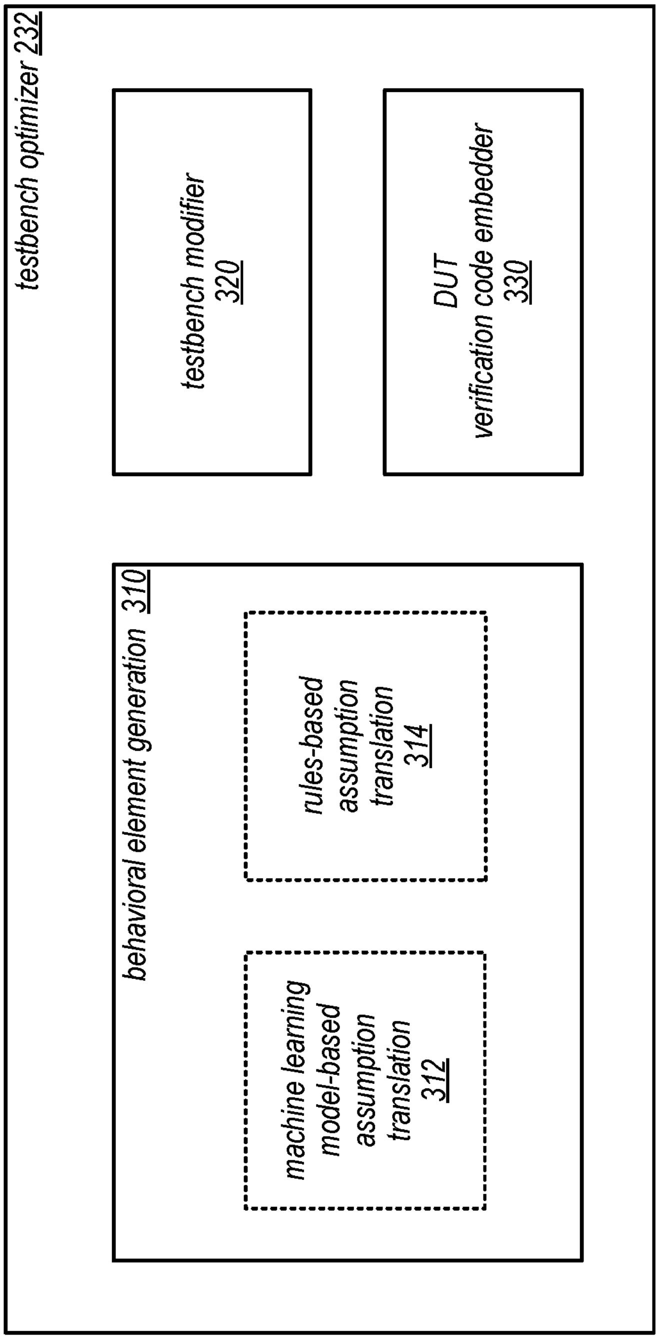
FIG. 3 is a logical block diagram illustrating a testbench optimizer that optimizes assumptions for executing a formal verification testbench, according to some embodiments.

FIG. 3 is a logical block diagram illustrating a testbench optimizer that optimizes assumptions for executing a formal verification testbench, according to some embodiments. Testbench optimizer 232 may implement behavioral element generation, in some embodiments. Behavioral element generation 310 may identify assumptions for optimization, in some embodiments. For example, behavioral element generation 310 may parse specifications of a formal verification testbench which may search for assumptions using keywords, such as "assume" or other operations, commands, or instructions that constrain inputs for a design under test. Once identified, behavioral element generation 310 may use various techniques for generating an assumption translation into a behavioral element.

For example, in some embodiments, behavioral element generation 310 may implement machine learning model-based assumption translation 312. The machine learning model 312 may take as input a design under test and assumption(s), for instance, and predict a behavioral element description (e.g., in a hardware description language) for replacing the assumption, in some embodiments. In some embodiments, a rules-based assumption translation 314 may be implemented. For example, different criteria, such as operators, number and/or types of inputs, and/or various other features of an assumption may be mapped to different behavioral elements (e.g., using a corresponding behavioral element template which determines a number, type, and arrangement of logical gates to detect a violation of the assumption as defined according to the operators or other features of the assumption and identified inputs to the DUT).

As discussed below with regard to FIG. 6, in some scenarios an assumption can be decomposed into multiple simpler assumptions, each of which can then be translated into a corresponding behavioral element.

As part of the behavioral element that may be generated, a reporting component (e.g., an interrupt signal) may be generated. For instance, a flip-flop or other storage element may be implemented that can store and remain set (e.g., to a value of "1") when the behavioral element detects that a violation of the constraint of the assumption has occurred.

Testbench optimizer 232 may implement testbench modifier 320 which may update the assumptions and assertions of the formal verification testbench to include an optimized assumption. For example, a formal verification testbench may be specified in a language, such as System Verilog, or other hardware description and verification language (HDVL). Testbench modifier 320 may make modifications to the specification of the formal verification testbench in the language, by rewriting, replacing, or removing a portion of the specification of the formal verification testbench. For example, an optimized assumption may be removed, as discussed above with regard to FIG. 1 and below with regard to FIG. 6. Testbench modifier 320 may also include modifications to an assertion to include asserting that an interrupt has not occurred so that a violation indicated by an interrupt will cause the assertion to fail. Likewise, testbench optimizer 232 may implement DUT verification code embedder 330. DUT verification code embedder 330 may add (e.g., insert, rewrite, append, etc.) the specification of the DUT in the hardware specification language to include the generated behavioral elements as the verification code for an optimized assumption. In this way, the various wires and logic gates or other components may be added to the design being verified using the formal verification testbench.

Figure 4:
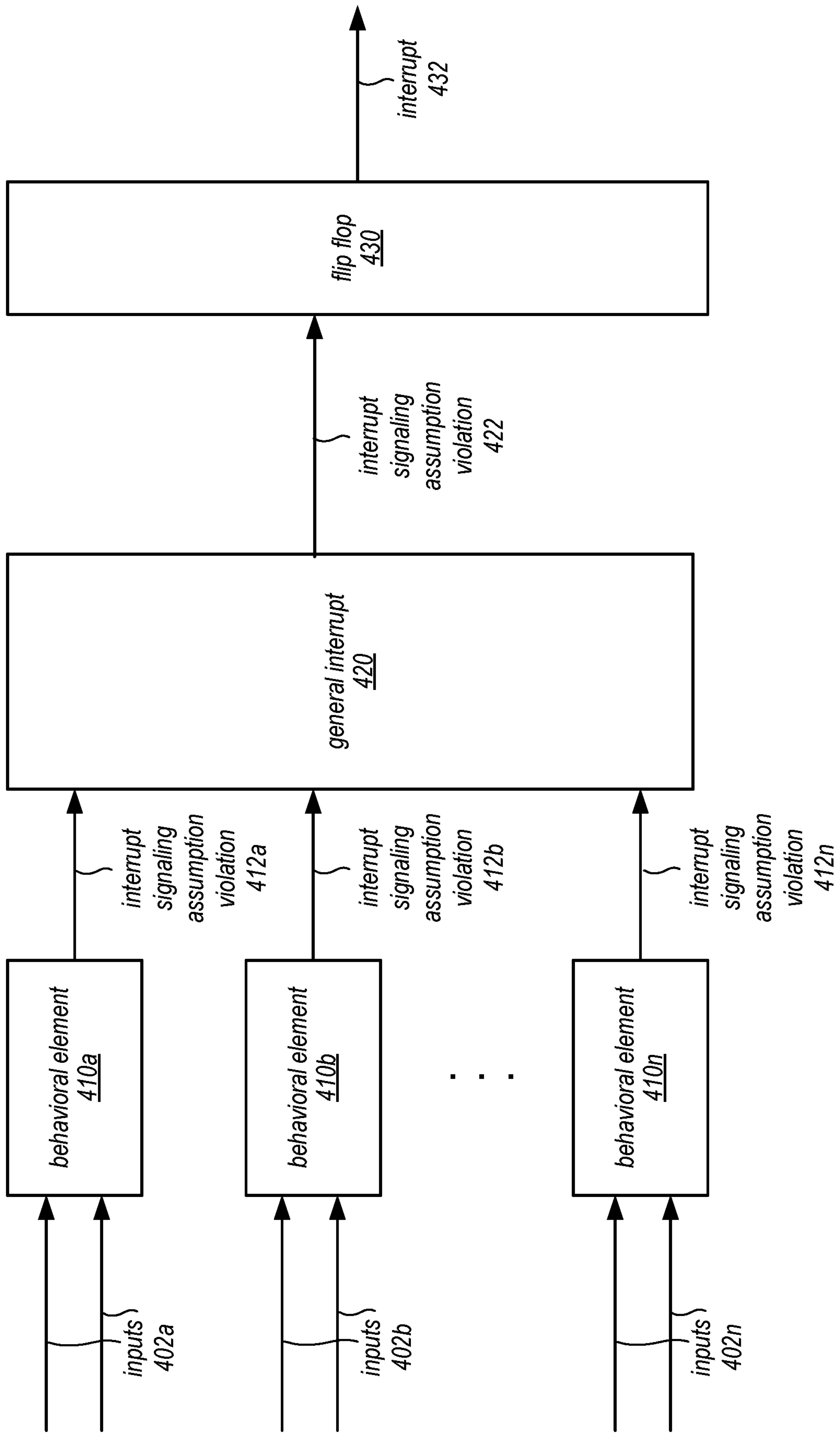
FIG. 4 is a logical block diagram illustrating a general interrupt that collects interrupt signals for different assumption optimizations, according to some embodiments.

In some scenarios, signals indicating optimized assumption violations can be handled as a group. FIG. 4 is a logical block diagram illustrating a general interrupt that collects interrupt signals for different assumption optimizations, according to some embodiments. In this example, behavioral elements 410*a*, 410*b*, and 410*n* may represent the various logical gates or elements used to detect violations of a constraint corresponding to an optimized assumption. Their respective inputs, 402*a*, 402*b*, and 402*n* may be evaluated respectively at the behavioral elements 410*a*, 410*b*, and 410*n*, where an interrupt signaling an assumption violation, as indicated at 412*a*, 412*b*, and 412*n* may be stored in a general interrupt 420 (e.g., which may sample or otherwise collect interrupt signals together (e.g., OR'd together using OR gates) to signal 432 a general interrupt stored 422 in a flip flop 430.

Figure 7:
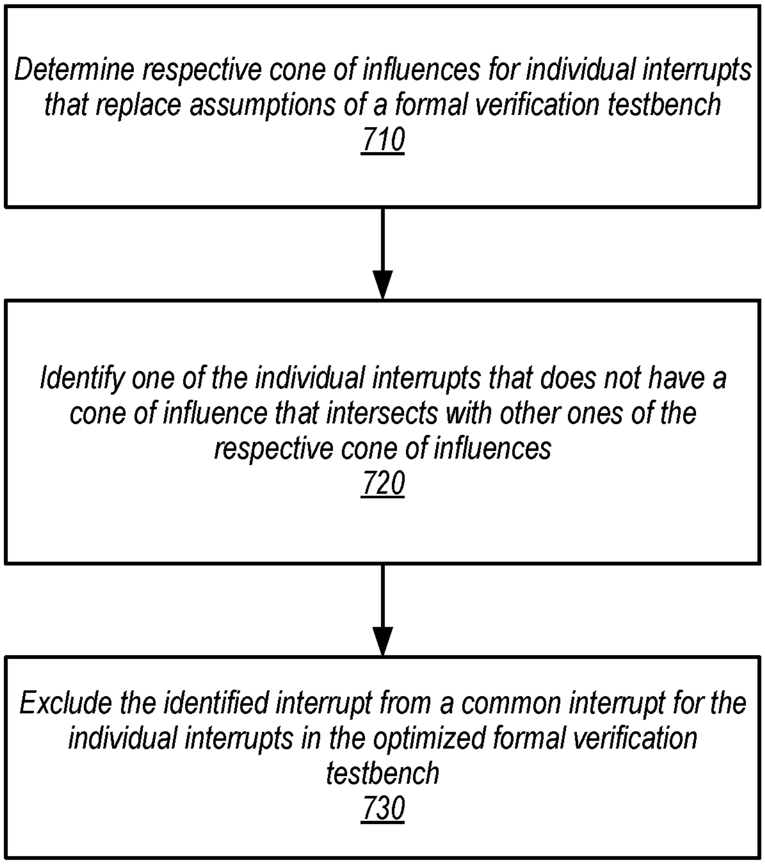
FIG. 7 is a high-level flowchart illustrating various methods and techniques to implement excluding an interrupt for an optimized assumption of a formal verification testbench, according to some embodiments.

As discussed in detail below with regard to FIG. 7, there may be some scenarios where an assumption's interrupt should not be collected with other interrupts. Likewise, different groupings of different interrupts may be made in order to collect dependent or related interrupts into common signals. Some assumption violations may be implemented as a single interrupt in some embodiments, while grouping may not be utilized at all in some other embodiments.

Figure 5:
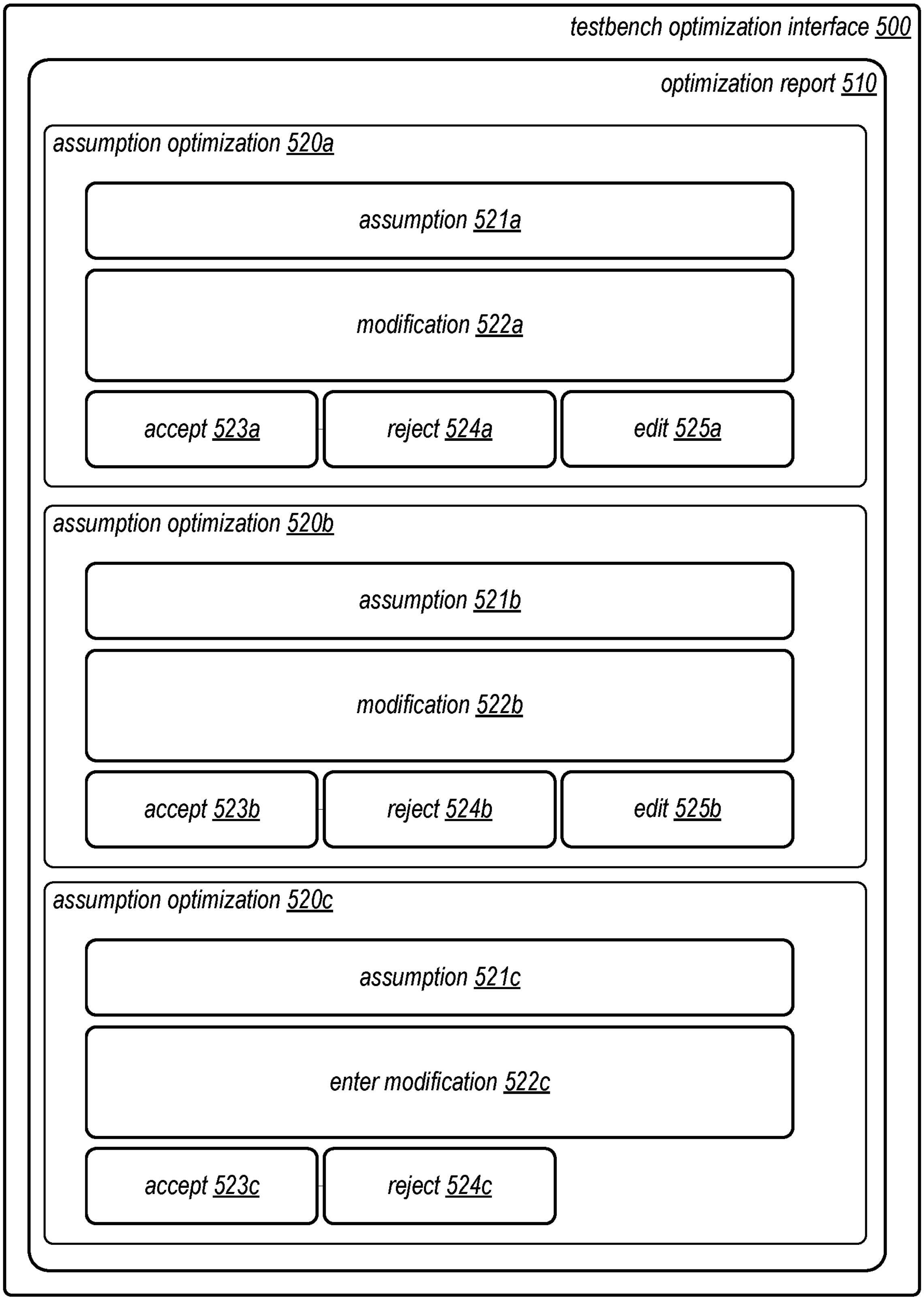
FIG. 5 is an example of an interface for reviewing assumption optimizations for a formal verification testbench, according to some embodiments.

FIG. 5 is an example of an interface for reviewing assumption optimizations for a formal verification testbench, according to some embodiments. Testbench optimization interface 500 may be a graphical user interface implemented as part of interface 222, in some embodiments, to provide various different interface elements for viewing, configuring, and modifying optimization for a design under test and formal verification testbench. For example, optimization report 510 may implement various menus, buttons, lists, drop-down boxes, selectors, text, inputs, upload mechanisms, and/or other graphical user interface elements to allow a user to optimize and then perform formal verification, in some embodiments.

In some embodiments, optimization report 510 may display or otherwise identify assumptions and proposed modifications for optimizing an identified assumption. For example, in assumption optimizations 520*a* and 520*b*, respective assumptions 521*a* and 521*b*, may be displayed or otherwise identified along with a proposed modification 522*a* and 522*b*. These modifications 522*a* and 522*b* may display the behavioral element to add to the DUT and the modification to an assertion to replace the identified assumption. As indicated 523*a* and 523*b*, the modification may be accepted. As indicated at 524*a* and 524*b*, the modification may be rejected. For example, it may be the case that a user desires to utilize the assumption and not the optimization replacement. As indicated at 525*a* and 525*b*, edit elements may be selected to make modifications to the design of the behavioral element and/or assertion modification.

In some scenarios, an assumption may be identified without being automatically optimized. However, testbench optimization interface 500 may provide a feature to allow a user to specify an optimization if desired. For example, assumption optimization 520*c* may include the identified assumption 521*c* and a user interface element to enter the modification 522*c*. Accept element 523*c* can then be used to proceed with using the entered modification, whereas reject element 524 can be selected to reject using an optimization for the identified assumption.

Although not illustrated, a user interface element may be implemented to cause the execution of the testbench that utilizes the accepted, edited, and/or rejected assumption optimizations and perform formal verification by executing the formal verification testbench. For example, the execution of the formal verification testbench may be performed to instantiate the design under test and begin perform verification using the assumptions, if any, and assertions specified in the testbench.

The examples discussed above with regard to FIGS. 1-5 have been given in regard to an example system verification application. Note that various other types or configurations of applications, including hardware development applications, may implement optimizing assumptions for executing a formal verification testbench and thus may implement these techniques. In addition to the examples given above, the techniques discussed below with regard to FIGS. 6 and 7 may be also implemented using the various components discussed above as well as different types of systems or devices that perform formal verification on a hardware design.

Figure 6:
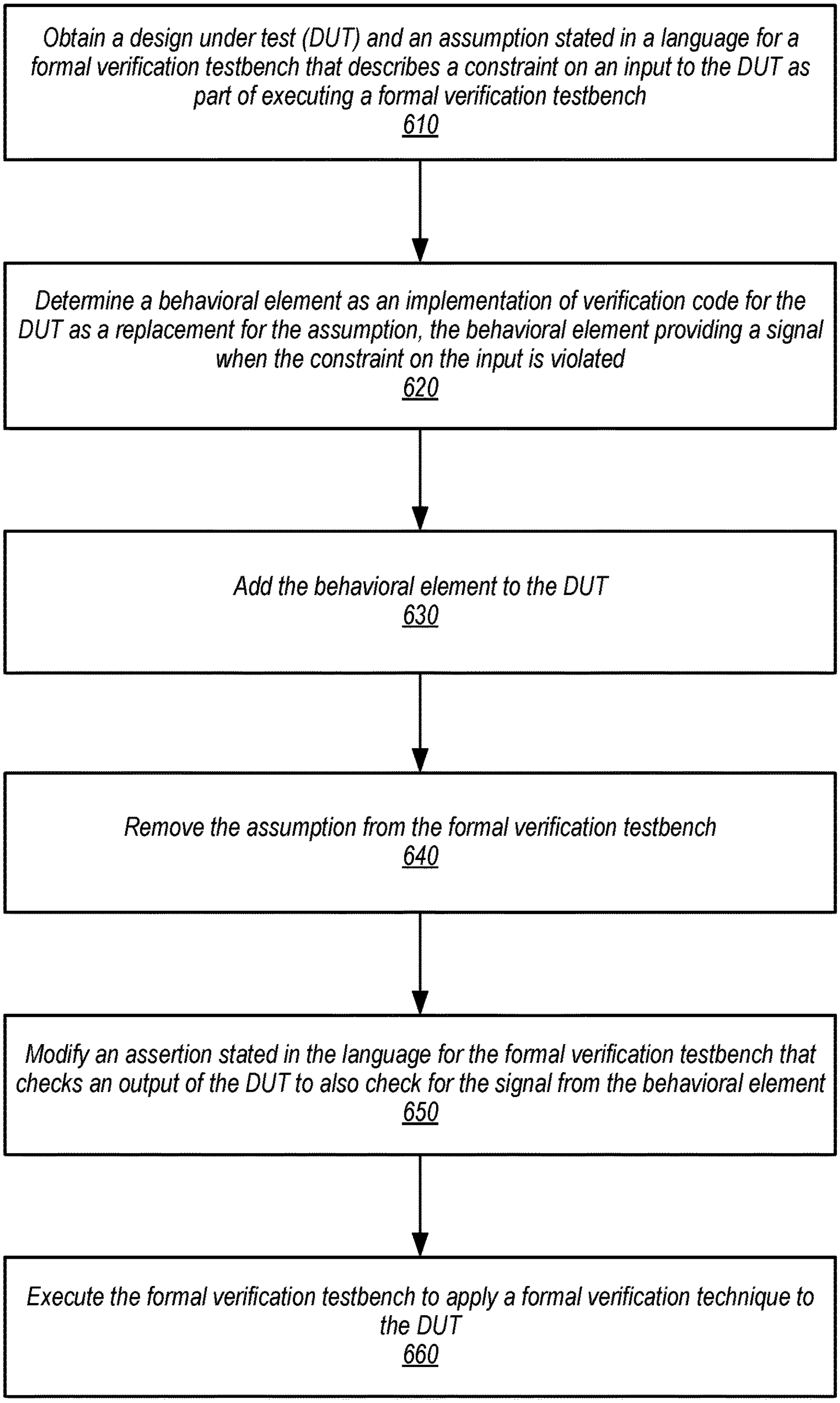
FIG. 6 is a high-level flowchart illustrating various methods and techniques to implement optimizing assumptions for executing a formal verification testbench, according to some embodiments.

FIG. 6 is a high-level flowchart illustrating various methods and techniques to implement optimizing assumptions for executing a formal verification testbench, according to some embodiments. As indicated at 610, a design under test (DUT) and an assumption stated in a language for the formal verification testbench that describes a constraint on an input to the DUT as part of executing a formal verification testbench may be obtained, according to some embodiments. For example, an interface may be implemented to upload, edit, enter, or otherwise provide the DUT specified according to a hardware language (e.g., such as hardware description languages like VHDL, Verilog, and RHDL, among others). The formal verification testbench may likewise be specified in a script or language (e.g., System Verilog). An assumption may be a statement in the language that describes a property or feature of the formal verification testbench that constrains one or more inputs to the DUT as part of executing formal verification, in some embodiments. In some embodiments, an assertion may also be stated in the language for the formal verification testbench that may describe a check on one or more output values of the DUT (e.g., a criteria or other condition that the one or more output values should satisfy).

As indicated at 620, a behavioral element as implementation for verification code for the DUT may be determined to add to the DUT as a replacement for the assumption, the behavioral element providing a signal when the constraint on the input is violated, according to some embodiments. As discussed above with regard to FIG. 3, different techniques for determining a behavioral element for an assumption optimization may be implemented. For example, a rules-based technique may identify the nature of the constraint by operator (e.g., "not", "and", "or", "if . . . else", "|→", and "|=>"), and then determine a corresponding set of logical gates that take inputs to the DUT for the assumption that are constrained and would indicate an occurrence when the constraint is violated. In another example, a machine learning model or other pattern recognition technique may be used for the behavioral element (e.g., using training sets with varying examples of both original assumptions and corresponding behavioral elements). In some embodiments, assumptions that are identified and optimized may be single clock assumptions. However, in other embodiments, multi-clock or other complex assumptions may be optimized. For example, a complex assumption may be decomposed into multiple simple assumptions, which may then be translated into corresponding behavioral components.

As indicated at 630, the behavioral element may be added to the DUT, according to some embodiments. For example, hardware description language may be generated and inserted into the specification of the DUT to add the appropriate wires, flip-flops, and other logical features to check for a violation of the constraint on the inputs specified by the assumption. This modified DUT may then be saved, stored, or otherwise preserved for use in subsequent execution of the formal verification testbench. In some embodiments, the original version may be retained in order to allow for user input to select between an optimized and un-optimized version of the DUT and formal verification testbench.

As indicated at 640, the assumption may be removed from the formal verification testbench, according to some embodiments. For example, the assumption may be deleted from the specification of the formal verification testbench. In another example, a Null or other value that causes the assumption to be effectively ignored or otherwise satisfied may be used to update the assumption in the specification of the formal verification testbench. In some embodiments, the original version of the formal verification testbench may be retained in order to allow for user input to select between an optimized and un-optimized version of the DUT and formal verification testbench.

As indicated at 650, an assertion stated in the language for the formal verification testbench may be modified that checks an output of the DUT to also check for the signal from the behavioral element, according to some embodiments. For example, the assertion statement in the specification of the formal verification testbench may be overwritten or rewritten to include as a property of the assertion that an interrupt did not occur).

As discussed above with regard to FIG. 5, in some embodiments, assumption optimization may be interactively performed based on feedback/approval, edits, or other information that may be provided via an interface of a formal verification system. In other embodiments, assumption optimization may be automatically or transparently performed.

As indicated at 660, the formal verification testbench may be executed to apply a formal verification technique to the DUT, according to some embodiments. For example, the updated version of the formal verification testbench and the modified DUT may be used as inputs to the formal verification tool that can apply a formal verification technique using the criteria of the formal verification testbench (e.g., applying remaining assumptions, if any, and checking using assertions) to the modified DUT. A result may be generated which may indicate, for example, if an interrupt signal that violated the assumption as represented by the behavioral element occurred using the modified assertion. For instance, a counter example that caused the interrupt signal and other information generated as part of a formal verification tool may be also provided.

Optimizing assumptions for formal verification testbenches allows for many different improvements to increase the efficiency of the formal verification testbench. As discussed above with regard to FIG. 4, interrupts can be combined into a single interrupt signal. However, in some scenarios this may not be optimal. FIG. 7 is a high-level flowchart illustrating various methods and techniques to implement excluding an interrupt for an optimized assumption of a formal verification testbench, according to some embodiments.

As indicated at 710, respective cone of influences for individual interrupts (or other behavioral elements) determined for assumptions of a formal verification testbench, according to some embodiments. For example, the variables included in a cone of influence set for an interrupt may be determined. Variables that directly occur in an assumption specification (e.g., "A→B", may be the variables "A" and "B"). Then, for each variable in the cone of influence set, all variables that appear on the right-hand side of the register transfer level (RTL) assignments (as described in the DUT) to this variable may be identified and added to the cone of influence set.

Once cone of influences are determined for each interrupt being optimized, then a comparison of the cone of influences may be performed. For example, intersection may occur when a cone of influence includes one or more variables also included in another cone of influence and thus intersects with that cone of influence. Intersecting cone of influences may be indicative of relations or dependencies between assumptions and thus may indicate when corresponding interrupts that signal violations of the assumptions can be combined into a common interrupt signal may be performed (as discussed in detail above with regard to FIG. 4). For those cone of influences that do not intersect with other cone of influences, the corresponding assumption may not have a relation or dependency with other assumptions and thus may be separately signaled (or left un-optimized in the formal verification testbench). For example, as indicated at 720, one of the individual assumptions may be identified that does not have a cone of influence that intersects with other ones of the respective cone of influences, according to some embodiments.

As indicated at 730, the identified interrupt may be excluded from a common interrupt for the assumptions in the optimized formal verification testbench may be excluded, according to some embodiments. Instead, as noted above, the interrupt may be separately signaled (or not optimized with a behavioral element).

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

Figure 8:
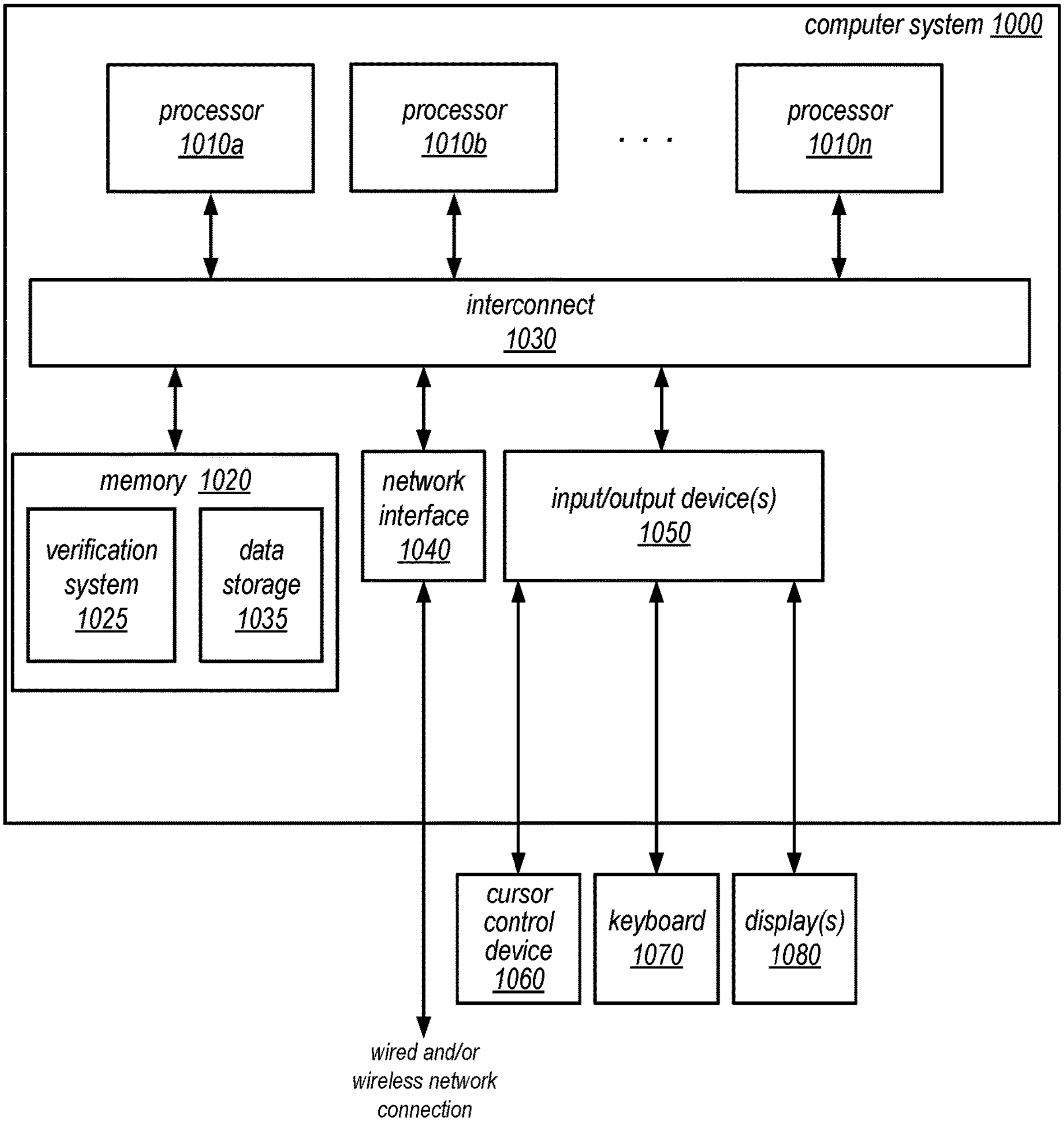
FIG. 8 is an example computer system, according to some embodiments.

Embodiments of optimizing assumptions for executing a formal verification testbench as discussed above may be implemented as part of a computer system. One such computer system is illustrated by FIG. 8. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node, compute node, computing device, compute device, or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions, such as program instructions to implement a verification system 1025 (like formal verification system 110 or verification system 210 discussed above with regard to FIGS. 1 and 2) and data storage 1035, respectively. In other embodiments, program instructions and/or data may be received, sent or stored upon different types of computer-accessible media or on similar media separate from system memory 1020 or computer system 1000. Generally speaking, a non-transitory, computer-readable storage medium may include storage media or memory media such as magnetic or optical media, e.g., disk or CD/DVD-ROM coupled to computer system 1000 via I/O interface 1030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

Those skilled in the art will appreciate that computer system 1000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:

at least one processor; and a memory, storing program instructions that when executed by the at least one processor, cause the at least one processor to implement a formal verification system, the formal verification system configured to:

receive, via an interface of the formal verification system, a design under test (DUT) and an assumption statement in a language for a formal verification testbench that describes a constraint on an input to the DUT as part of executing the formal verification testbench and an assertion in the language that describes a check on an output of the DUT;

determine an interrupt component as an implementation of verification code for the DUT to add to the DUT as a replacement for the assumption, wherein the interrupt component outputs a signal when the constraint on the input is violated;

add the interrupt component to the DUT;

remove the assumption from the formal verification testbench;

modify the assertion of the formal verification testbench to check for the signal from the interrupt component;

execute the formal verification testbench to apply a formal verification technique to the DUT; and return, via the interface of the formal verification system, a result of the execution of the formal verification testbench.

2. The system of claim 1, wherein a further assumption is included in the formal verification testbench, wherein the further assumption is replaced with a further interrupt component to add to the DUT as a replacement for the further assumption, and wherein the modified assertion checks for a general interrupt that combines signals from the interrupt component and the further interrupt component.

3. The system of claim 1, wherein the formal verification system is further configured to provide, via the interface of the formal verification system, an optimization report that describes a plurality of assumptions, including the assumption, that have replacement interrupt components.

4. The system of claim 1, wherein a further assumption is included in the formal verification testbench, and wherein the formal verification system is further configured to provide, via the interface of the formal verification system, a prompt to enter a modification to replace the further assumption.

5. A method, comprising:

obtaining, by a formal verification system, a design under test (DUT) and an assumption statement in a language for a formal verification testbench that describes a constraint on an input to the DUT as part of executing a formal verification testbench;

determining, by the formal verification system, a behavioral element as an implementation of verification code for the DUT to add to the DUT as a replacement for the assumption, wherein the behavioral element provides a signal when the constraint on the input is violated;

adding, by the formal verification system, the behavioral element to the DUT;

removing, by the formal verification system, the assumption from the formal verification testbench;

modifying, by the formal verification system, an assertion in the language for the formal verification testbench that describes a check on an output of the DUT to also check for the signal from the behavioral element; and executing, by the formal verification system, the formal verification testbench to apply a formal verification technique to the DUT.

6. The method of claim 5, wherein a further assumption is included in the formal verification testbench, wherein the further assumption is replaced with a further behavioral element to add to the DUT as a replacement for the further assumption, and wherein the modified assertion checks for a general interrupt that combines signals from the behavioral element and the further behavioral element.

7. The method of claim 5, wherein the assumption is a first one of a plurality of assumptions as part of executing the formal verification testbench and wherein the method further comprises:

determining, by the formal verification system, respective cone of influences for individual ones of behavioral elements determined for the plurality of assumptions;

identifying, by the formal verification system, one of the behavioral elements that does not have a cone of influence that intersects with other ones of the respective cone of influences; and excluding, by the formal verification system, a signal from the one behavioral element of the behavioral elements.

8. The method of claim 5, further comprising providing, via an interface of the formal verification system, an optimization report that describes a plurality of assumptions, including the assumption, that have behavioral elements, including the behavioral element, as respective replacements.

9. The method of claim 5, wherein determining the behavioral element to add to the DUT as a replacement for the assumption comprises decomposing the assumption into a plurality of simple assumptions that are respectively translated into a plurality of behavioral elements that together make up the behavioral element for the assumption.

10. The method of claim 5, further comprising providing, via an interface for the formal verification system, the behavioral element as a proposed modification to optimize performance of formal verification, wherein the adding, the removing, and the modifying are performed responsive to receiving an acceptance of the proposed modification via the interface of the formal verification.

11. The method of claim 5, wherein a further assumption is included in the formal verification testbench, wherein a proposal to replace the further assumption with a further behavioral element to add to the DUT is provided via an interface for the formal verification system, and wherein a rejection of the proposal to replace the further assumption is received via the interface for the formal verification system.

12. The method of claim 5, wherein a further assumption is included in the formal verification testbench, and wherein the method further comprises providing, via an interface of the formal verification system, a prompt to enter a modification to replace the further assumption.

13. The method of claim 5, wherein the signal from the behavioral element is provided via a flip flop that remains set once set.

14. One or more non-transitory, computer-readable storage media, storing program instructions that when executed on or across one or more computing devices cause the one or more computing devices to implement:

receiving a design under test (DUT) and an assumption statement in a language for a formal verification testbench that describes a constraint on an input to the DUT as part of executing a formal verification testbench and an assertion in the language that describes a check on an output of the DUT;

determining a behavioral element as an implementation of verification code for the DUT to add to the DUT as a replacement for the assumption, wherein the behavioral element provides a signal when the constraint on the input is violated;

adding the behavioral element to the DUT;

removing the assumption from the formal verification testbench;

modifying the assertion of the formal verification testbench to check for the signal from the behavioral element; and executing the formal verification testbench to apply a formal verification technique to the DUT.

15. The one or more non-transitory, computer-readable storage media of claim 14, wherein a further assumption is included in the formal verification testbench, wherein the further assumption is replaced with a further behavioral element to add to the DUT as a replacement for the further assumption, and wherein the modified assertion checks for a general interrupt that combines signals from the behavioral element and the further behavioral element.

16. The one or more non-transitory, computer-readable storage media of claim 14, wherein the assumption is a first one of a plurality of assumptions as part of executing the formal verification testbench and wherein the one or more non-transitory, computer-readable storage media store further program instructions that when executed by the one or more computing devices cause the one or more computing devices to further implement:

determining, by the formal verification system, a respective cone of influences for individual ones of behavioral elements determined for the plurality of assumptions;

identifying, by the formal verification system, one of the behavioral elements that does not have a cone of influence that intersects with other ones of the respective cone of influences; and excluding, by the formal verification system, a signal from the one behavioral element of the behavioral elements.

17. The one or more non-transitory, computer-readable storage media of claim 14, storing further program instructions that when executed cause the one or more computing devices to further implement providing, via an interface of the formal verification system, an optimization report that describes a plurality of assumptions including the assumption that have behavioral elements, including the behavioral element, as respective replacements.

18. The one or more non-transitory, computer-readable storage media of claim 14, wherein, in determining the behavioral element to add to the DUT as a replacement for the assumption, the program instructions cause the one or more computing devices to implement decomposing the assumption into a plurality of simple assumptions that are respectively translated into a plurality of behavioral elements that together make up the behavioral element for the assumption.

19. The one or more non-transitory, computer-readable storage media of claim 14, storing further program instructions that when executed cause the one or more computing devices to further implement providing, via an interface for the formal verification system, the behavioral element as a proposed modification to optimize performance of formal verification, wherein the adding, the removing, and the modifying are performed responsive to receiving an acceptance of the proposed modification via the interface of the formal verification.

20. The one or more non-transitory, computer-readable storage media of claim 14, wherein a further assumption is included in the formal verification testbench, and wherein the one or more non-transitory, computer-readable storage media store further program instructions that when executed by the one or more computing devices cause the one or more computing devices to further implement providing, via an interface of the formal verification system, a prompt to enter a modification to replace the further assumption.

* * * * *